US009576796B2

(12) United States Patent
Holland et al.

(10) Patent No.: US 9,576,796 B2
(45) Date of Patent: Feb. 21, 2017

(54) SEMICONDUCTOR DEVICES AND METHODS OF MANUFACTURE THEREOF

(71) Applicant: Taiwan Semiconductor Manufacturing Company, Ltd., Hsin-Chu (TW)

(72) Inventors: Martin Christopher Holland, Bertem (BE); Georgios Vellianitis, Heverlee (BE)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/713,952

(22) Filed: May 15, 2015

(65) Prior Publication Data

US 2016/0336177 A1    Nov. 17, 2016

(51) Int. Cl.
| H01L 21/02 | (2006.01) |
| H01L 29/06 | (2006.01) |
| H01L 21/311 | (2006.01) |
| H01L 21/306 | (2006.01) |

(52) U.S. Cl.
CPC ..... *H01L 21/02603* (2013.01); *H01L 21/0262* (2013.01); *H01L 21/02532* (2013.01); *H01L 21/02546* (2013.01); *H01L 21/02549* (2013.01); *H01L 21/30604* (2013.01); *H01L 21/31111* (2013.01); *H01L 29/0676* (2013.01)

(58) Field of Classification Search
CPC .......... H01L 21/02603; H01L 21/0262; H01L 21/31111; H01L 21/30604; H01L 21/02549; H01L 21/02532; H01L 21/02546; H01L 29/0676

USPC .......................................................... 438/492
See application file for complete search history.

(56) References Cited

U.S. PATENT DOCUMENTS

| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |

(Continued)

*Primary Examiner* — Caleen Sullivan
(74) *Attorney, Agent, or Firm* — Slater Matsil, LLP

(57) ABSTRACT

A method of manufacturing a semiconductor device may include: forming an opening in an insulating layer to expose a portion of a major surface of a substrate, the substrate comprising a first semiconductor material; forming a protrusion in the opening using a first epitaxial growth process, the protrusion comprising a first portion disposed in the opening and a second portion extending out of the opening, the protrusion comprising a second semiconductor material different from the first semiconductor material; and forming the second semiconductor material on sidewalls of the second portion of the protrusion using a second epitaxial growth process different from the first epitaxial growth process.

19 Claims, 15 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 2007/0267722 A1* | 11/2007 | Lochtefeld ........ H01L 21/02381 257/618 |
| 2010/0072515 A1* | 3/2010 | Park .................. H01L 21/02494 257/190 |
| 2014/0001574 A1 | 1/2014 | Chen et al. |
| 2014/0110755 A1 | 4/2014 | Colinge |
| 2014/0151812 A1 | 6/2014 | Liaw |

* cited by examiner

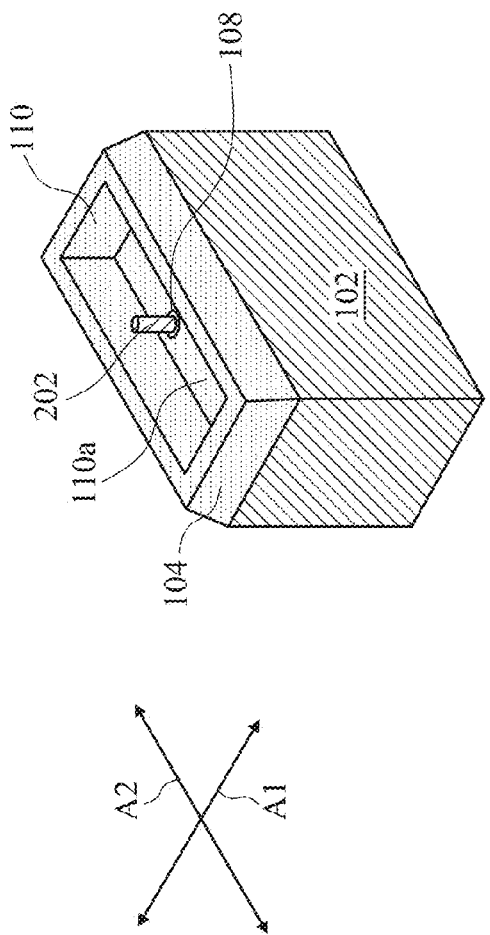

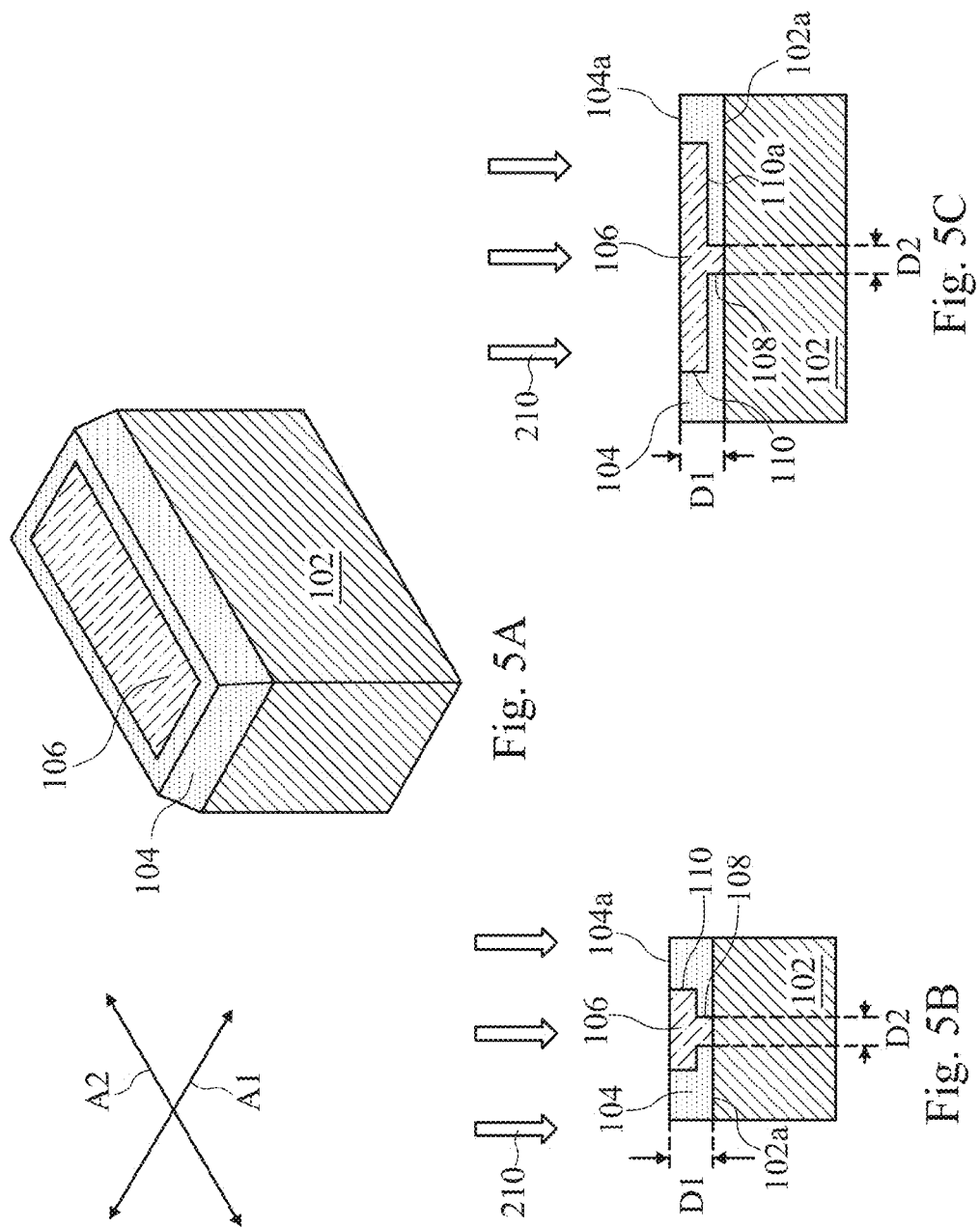

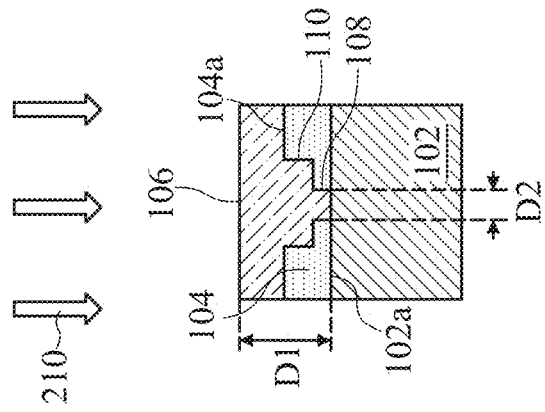
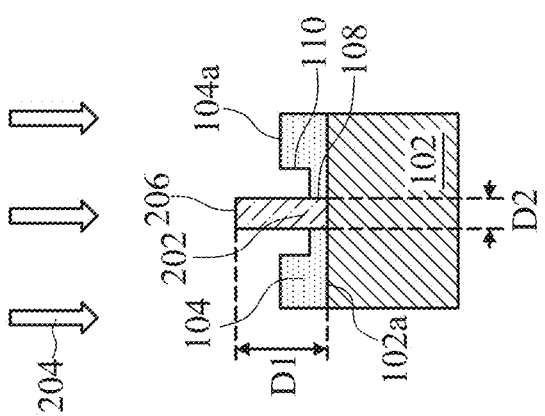

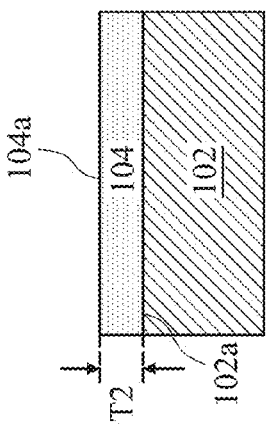
Fig. 9C
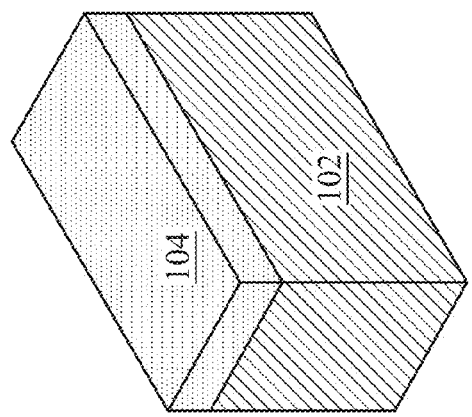
Fig. 9A
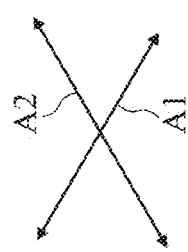
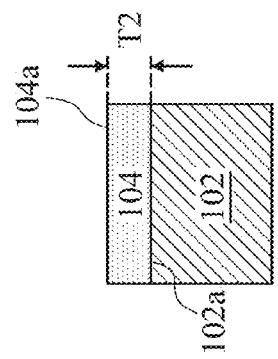
Fig. 9B

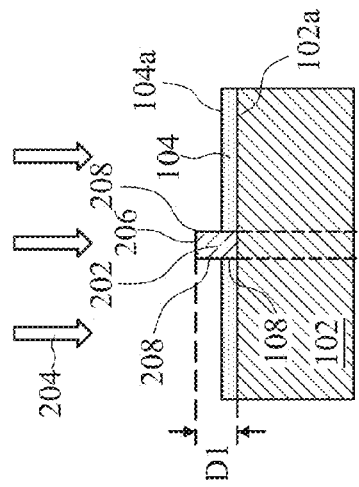
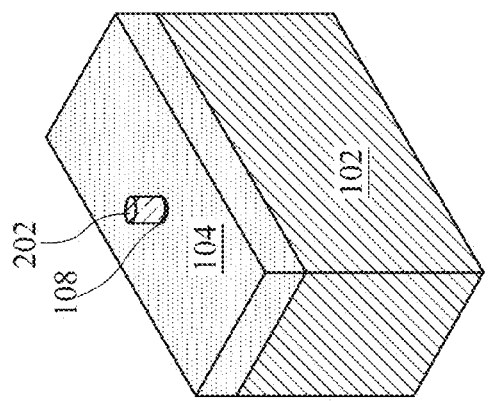
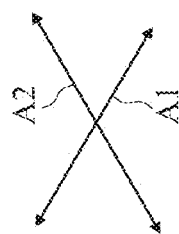
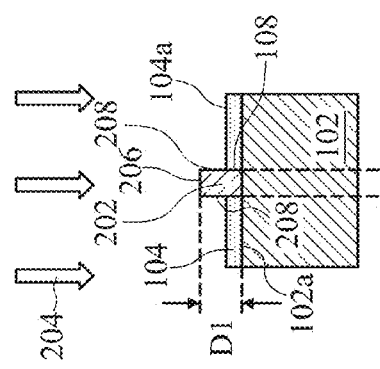
Fig. 11A
Fig. 11B
Fig. 11C

SEMICONDUCTOR DEVICES AND METHODS OF MANUFACTURE THEREOF

BACKGROUND

The semiconductor industry has experienced rapid growth due to continuous improvements in the integration density of a variety of electronic components (e.g. transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

Fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross sectional view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

As technologies further evolve, semiconductor process nodes have been scaled down for high density integrated circuits. As a result, the form factor of integrated circuit has been improved from shrinking the semiconductor process node (e.g., shrink the process node towards the sub-20 nm node). As semiconductor devices are scaled down, new techniques are needed to maintain the electronic components' performance from one generation to the next. For example, transistors formed by high carrier mobility materials such as group III-V materials, germanium and/or the like are desirable for high density and high speed integrated circuits.

High carrier mobility materials offer various advantages in comparison with silicon. However, silicon wafers are dominant in the semiconductor industry because of the high cost associated with high carrier mobility material wafers. One solution to fabricating high carrier mobility material based transistors is growing high carrier mobility material active regions on silicon substrates through an epitaxial growth process. When a high carrier mobility material layer is grown on a silicon substrate, the high carrier mobility material may be compressively strained to fit the lattice spacing of the silicon substrate. After the thickness of the high carrier mobility material layer surpasses a critical thickness, the strain may be relieved by forming a variety of threading dislocations. Such threading dislocations are defects, which may degrade electrical properties of high carrier mobility material based transistors. Stacking faults caused by the growth of the high carrier mobility material layer on the silicon substrate also degrade electrical properties of such transistors. Methods of reducing or eliminating threading dislocations and stacking faults may be needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2C, 3A to 3C, 4A to 4C, 5A to 5C, and 6A to 6C show various views of a process flow illustrating a method of manufacturing a FinFET device, in accordance with an embodiment.

FIGS. 7A and 7B show cross-sectional views of a FinFET device in an intermediate stage of manufacture, in accordance with an embodiment.

FIGS. 9A to 9C, 10A to 10C, 11A to 11C, 12A to 12C, 13A to 13C, and 14A to 14C show various views of a process flow illustrating a method of manufacturing a FinFET device, in accordance with an embodiment.

DETAILED DESCRIPTION

Figure 1B:
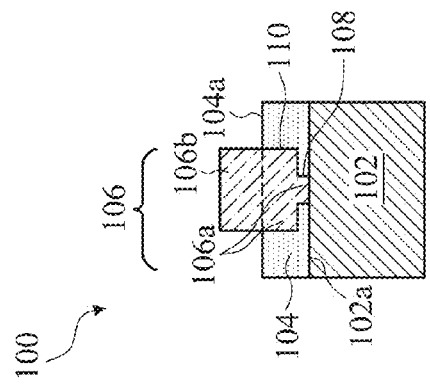
FIGS. 1A to 1C show various views of a FinFET device, in accordance with an embodiment.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1C:
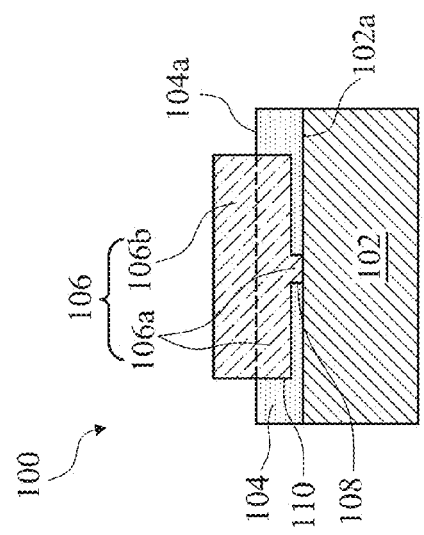
Figure 1A:
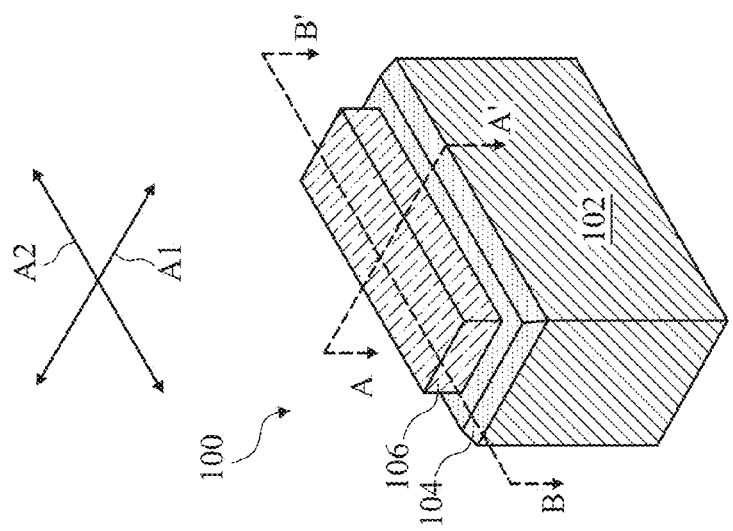

FIGS. 1A to 1C show various views of a fin field effect transistor (FinFET) device 100, in accordance with one or more embodiments. FIG. 1A illustrates a perspective view of the FinFET device 100, while FIGS. 1B and 1C illustrate cross-sectional views of the FinFET device 100 shown in FIG. 1A along lines A-A' and B-B', respectively. The line A-A' may be parallel to a first axis A1 (e.g. transverse axis) of the FinFET device 100, while the line B-B' may be parallel to a second axis A2 (e.g. longitudinal axis) of the FinFET device 100. The second axis A2 may be substantially perpendicular to the first axis A1. The FinFET device 100 includes a substrate 102, an isolation region 104, and a fin 106 (or fin structure) extending from the substrate 102. In the examples shown in FIGS. 1A to 1C, only one fin 106 is shown; however, the number of fins of the FinFET device 100 may be more than one (e.g. two, three, four, five, or more) in other embodiments. As an example, a plurality of fins 106 may extend from the substrate 102, and a portion (e.g. lower portion) of each of the plurality of fins 106 may be surrounded by the isolation region 104.

The substrate 102 of the FinFET device 100 may comprise a first semiconductor material. As an example, the first semiconductor material may comprise silicon, although other semiconductor materials may be possible as well, such as group III, group IV, group V elements, or combinations thereof. Examples include germanium, gallium, arsenic, or combinations thereof. The first semiconductor material of the substrate 102 may have a crystalline structure. As an example, the crystalline structure of the first semiconductor material of the substrate 102 may have a <001> crystal orientation or a <111> crystal orientation.

The FinFET device 100 comprises the isolation region 104 disposed at a major surface 102a of the substrate 102. The isolation region 104 may be an insulating layer and may be implemented by a shallow trench isolation (STI) structure. The isolation region 104 may comprise a dielectric material such as an oxide material, a high-density plasma (HDP) oxide, or the like. The isolation region 104 may serve to electrically insulate the fin 106, e.g. from another fin that may be laterally separated from the fin 106. The isolation region 104 may include an opening 108 and a trench 110 formed therein. The opening 108 may, as an example, be referred to as a via.

The FinFET device 100 includes the fin 106, which comprises a second semiconductor material different from the first semiconductor material of the substrate 102. The second semiconductor material may have a crystalline structure and may be selected from the group consisting of group IV elements, group III-V compounds, group II-VI compounds, other compound semiconductors, combinations thereof, or the like. As an example, the second semiconductor material may be germanium, silicon-germanium (SiGe), indium arsenide (InAs), indium gallium arsenide ($In_xGa_{1-x}As$), indium antimonide (InSb), gallium arsenide (GaAs), gallium antimonide (GaSb), combinations thereof, or the like. The second semiconductor material may be a material that has a higher carrier mobility (e.g. electron and/or hole mobility) compared to the first semiconductor material. In some embodiments, the second semiconductor material and the first semiconductor material may have different crystalline structures (e.g. different lattice constants and/or different crystal orientations).

The fin 106 may comprise a first portion 106a disposed within the opening 108 and the trench 110 of the isolation region 104. Consequently, the first portion 106a of the fin 106 may be surrounded by the isolation region 104. The fin 106 may additionally comprise a second portion 106b, which may disposed over the first portion 106a. The second portion 106b of the fin 106 may be distal the substrate 102, while the first portion 106a of the fin 106 may be proximal the substrate 102. The second portion 106b of the fin 106 may extend from the first portion 106a of the fin 106, e.g. in a direction away from the substrate 102. In some embodiments, the second portion 106b of the fin 106 may function as a channel region of the FinFET device 100.

The FinFET device 100 may be used for scaled complementary metal oxide semiconductor (CMOS) nodes for the advantageous effects it offers in terms of short channel effect control, performance, and stand-by power compared to planar FETs. The scaled CMOS nodes may require the channel region of the FinFET device 100 to comprise a high mobility semiconductor material (such as the second semiconductor material) in order to deliver improved circuit performance. However, as shown in FIGS. 1A to 1C, the second semiconductor material of the fin 106 may be formed over the first semiconductor material of the substrate 102. In some methods of manufacturing the FinFET device 100, this may lead to structural defects (e.g. stacking faults and/or threading dislocations) being formed in the fin 106, e.g. as a consequence of the different crystalline structures of the first semiconductor material and the second semiconductor material. As a first illustration, in examples where the substrate 102 comprises silicon having a <001> crystal orientation and selective area growth (SEG) and/or blanket growth is used to form the fin 106, structural defects may be formed along a <110> crystal orientation of the second semiconductor material of the fin 106, at an interface between the first and second semiconductor materials, and/or at sidewalls of the trench 110. As a second illustration, in examples where the substrate comprises silicon having a <111> crystal orientation and SEG and/or blanket growth is used to form the fin 106, structural defects may be formed along a <110> crystal orientation of the second semiconductor material of the fin 106 and may extend to a top surface of the fin 106. These structural defects can adversely affect the performance of the FinFET device 100. Consequently, the use of SEG and/or blanket growth to form the fin 106 may be yield undesirable effects.

FIGS. 2A to 2C, 3A to 3C, 4A to 4C, 5A to 5C, and 6A to 6C show a process flow illustrating a method of manufacturing a FinFET device, in accordance with one or more embodiments. The method illustrated in FIGS. 2A to 2C, 3A to 3C, 4A to 4C, 5A to 5C, and 6A to 6C results in the FinFET device 100 being substantially free from structural defects such as stacking faults and threading dislocations, and thus can yield a FinFET device 100 that can deliver improved electrical performance.

Figure 2C:
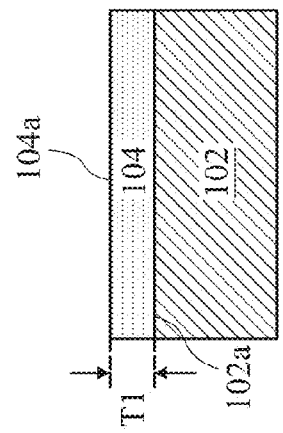
Figure 2A:
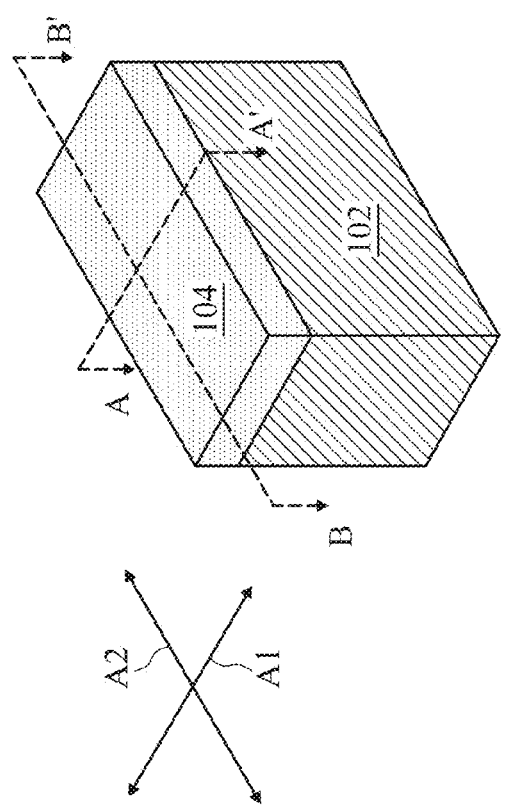
Figure 2B:
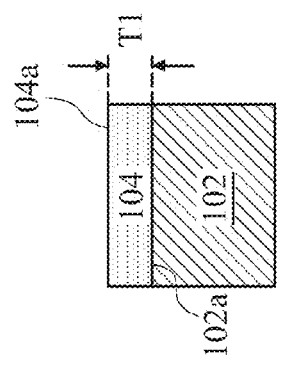

Referring to FIGS. 2A to 2C, the isolation region 104 comprising an insulating material is formed over the major surface 102a of the substrate 102. FIG. 2A shows a perspective view of the isolation region 104 formed atop the major surface 102a of the substrate 102, while FIGS. 2B and 2C show cross-sectional views of FIG. 2A taken along lines A-A' and B-B', respectively. As described above in relation to FIGS. 1A to 1C, the substrate 102 may comprise the first semiconductor material, while the isolation region 104 may comprise a dielectric material such as an oxide material, a high-density plasma (HDP) oxide, or the like. The isolation region 104 may be formed by spin-on techniques, electrochemical plating, chemical vapor deposition (CVD), physical vapor deposition (PVD), atomic layer deposition (ALD), molecular beam epitaxy CVD, or the like. At this stage of the process flow, the isolation region 104 may have a first thickness T1 in a range from about 50 nanometers to about 100 nanometers, although other thickness may be possible as well.

Figure 3A:
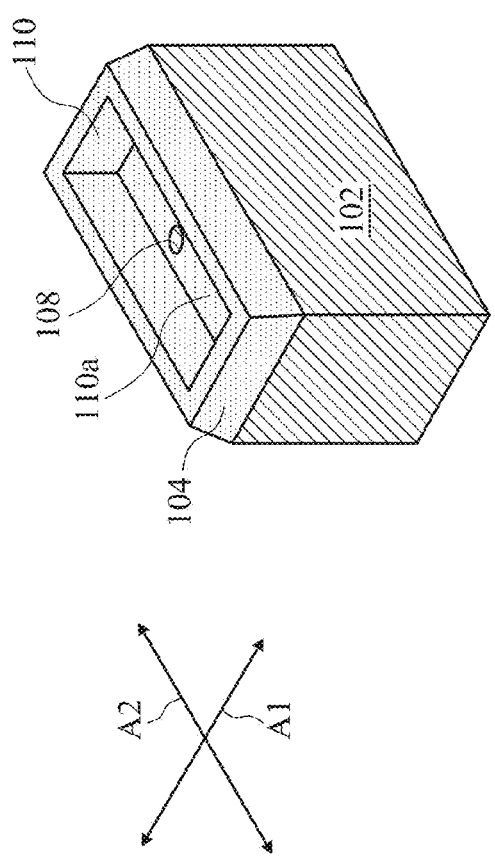
Figure 3C:
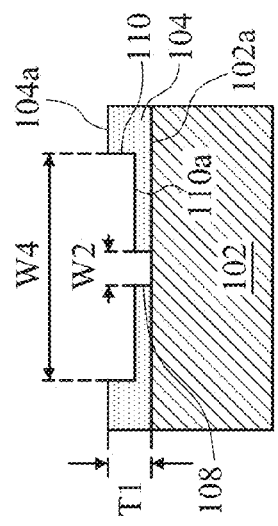
Figure 3B:
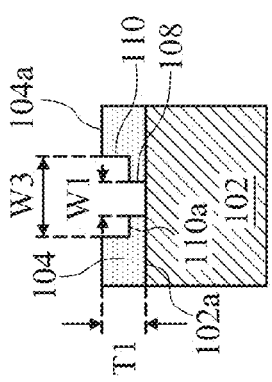

Referring to FIGS. 3A to 3C, the opening 108 and the trench 110 may be formed in the isolation region 104. The opening 108 may have a first width W1 along the first axis A1, and a second width W2 along the second axis A2. In an embodiment, the first width W1 may be substantially equal to the second width W2. In another embodiment, the first width W1 may be different from the second width W2. The first width W1 and the second width W2 may each be in a range from about 3 nanometers to about 50 nanometers, e.g. in a range from about 5 nanometers to about 40 nanometers, although other widths may be possible as well in accordance with other embodiments. The trench 110 may have a third width W3 taken along the first axis A1, and a fourth width W4 taken along the second axis A2. The third width W3 may be different from (e.g. less than) the fourth width W4. In an embodiment, the third width W3 may be in a range from about 5 nanometers to about 50 nanometers, while the fourth width W4 may be in a range from about 20 nanometers to about 100 nanometers, although other widths may be possible as well in accordance with other embodiments.

The opening 108 and the trench 110 may be formed using suitable techniques including photolithography and etching processes. As an example, the photolithography and etching processes may comprise depositing a mask material (such as photoresist) over the isolation region 104, exposing the mask material to a pattern, and etching the isolation region 104 in accordance with the pattern to form the opening 108 and the trench 110. These steps are not shown in FIGS. 3A to 3C for the sake of brevity.

In one embodiment, the opening 108 may be formed prior to forming the trench 110. As an example, the opening 108 may be formed (e.g. using the above-described photolithography and etching processes) in the isolation region 104 and may extend from the major surface 104a of the isolation region 104 to the major surface 102a of the substrate 102, such that a portion of the substrate 102 is exposed by the opening 108. In some embodiments, the opening 108 may be formed in a central region of the isolation region 104. Thereafter, a portion of the opening 108 (e.g. the portion of the opening 108 proximal the major surface 104a of the isolation region 104, e.g. an upper portion of the opening 108) may be widened (e.g. using the above-described photolithography and etching processes) to form the trench 110.

In another embodiment, the trench 110 may be formed prior to forming the opening 108. As an example, the trench 110 may be formed (e.g. using the above-described photolithography and etching processes) in the isolation region 104 and may extend from the major surface 104a of the isolation region 104 into a portion of the isolation region 104. In forming the trench 110, a portion of the isolation region 104 may define a floor 110a of the trench 110. Thereafter, a portion of the isolation region 104 at the floor 110a of the trench 110 may be removed (e.g. using the above-described photolithography and etching processes) to expose a portion of the substrate 102, thereby forming the opening 108. In some embodiments, the opening 108 may be formed in a central region of the trench 110.

Referring to FIGS. 4A to 4C, a protrusion 202 may be formed in the opening 108 using a first growth process (indicated as arrows 204). The protrusion 202 may comprise the second semiconductor material described above in respect of FIGS. 1A to 1C. The protrusion 202 may fill the opening 108 and may extend away from the major surface 102a of the substrate 102 (e.g. in a direction substantially perpendicular to the major surface 102a of the substrate 102). As shown in FIGS. 4B and 4C, the protrusion 202 may contact (e.g. physically contact) sidewalls of the opening 108, but may be spaced apart from sidewalls of the trench 110. In an embodiment, the protrusion 202 may be a wire (e.g. a nanowire). The protrusion 202 may be formed to have a first dimension D1 (e.g. a height), which may be measured from the major surface 102a of the substrate 102. The first dimension D1 may be in a range from about 50 nanometers to about 200 nanometers. In addition, the protrusion 202 may be formed to have a second dimension D2 (e.g. a width), which may be in a range from about 3 nanometers to about 50 nanometers (e.g. in a range from about 5 nanometers to about 10 nanometers). In some embodiments, the second dimension D2 may be substantially equal to the first width W1 and/or the second width W2 of the opening 108.

In some embodiments, as in the examples of FIGS. 4A to 4C, the protrusion 202 may be formed such that a surface 206 of the protrusion 202 facing away from the substrate 102 is substantially coplanar with the major surface 104a of the isolation region 104. In such embodiments, the protrusion 202 may be disposed (e.g. fully disposed) within the trench 110 and the opening 108 of the isolation region 104. In other embodiments, however, the protrusion 202 may extend out the trench 110 such that the surface 206 of the protrusion 202 is farther from the major surface 102a of the substrate 102 than the major surface 104a of the isolation region 104. A cross-sectional view of an example of such an embodiment is shown in FIG. 7A.

The first growth process 204 may comprise a first epitaxial growth process, such as a first metal organic chemical vapor deposition (MOCVD) process. The process parameters of the first growth process 204 may be chosen such that growth of the second semiconductor material in a direction substantially perpendicular to the major surface 102a of the substrate 102 (e.g. herein referred to as vertical growth) is promoted, while growth of the second semiconductor material in a direction substantially parallel to the major surface 102a of the substrate 102 (e.g. herein referred to as lateral or radial growth) is suppressed, prevented, or substantially eliminated.

As an example, a temperature of the first growth process 204 may be in a range from about 500 degrees Celsius to about 650 degrees Celsius (e.g. in a range from about 540 degrees Celsius to about 600 degrees Celsius). As an example, the substrate 102 may be heated to and/or maintained at the above-mentioned range of temperatures. This range of temperatures may promote vertical growth of the second semiconductor material, while suppressing, preventing, or otherwise eliminating lateral or radial growth of the second semiconductor material. Illustratively, when the substrate 102 comprises silicon having a <111> crystal orientation and the second semiconductor material comprises indium and arsenic (e.g. InAs or $In_xGa_{1-x}As$), the above-described temperature range suppresses, prevents, or otherwise substantially eliminates lateral or radial growth of the second semiconductor material by decreasing the number of bonds available for indium atoms at surfaces of the second semiconductor material having a <110> crystal orientation. Surfaces of the semiconductor material having the <110> crystal orientation may include sidewalls 208 of the protrusion 202. This decrease in the number of bonds available for indium atoms may be a result of arsenic desorption.

As another example, a molar ratio of precursors of the first growth process 204 may be less than about 400 (e.g. in a range from about 300 to about 350) in order to promote vertical growth of the second semiconductor material, while suppressing, preventing, or otherwise eliminating lateral or radial growth of the second semiconductor material. Illustratively, when the substrate 102 comprises silicon having a <111> crystal orientation and the second semiconductor material comprises a group III-V material, the molar ratio of the V/III precursors of the first growth process 204 may be in the above-described range in order to promote vertical growth of the second semiconductor material, while suppressing, preventing, or otherwise eliminating lateral or radial growth of the second semiconductor material.

By virtue of the dimensions D1 and D2 of the protrusion 202 and the first growth process 204 (e.g. process parameters and/or molar ratios thereof), the protrusion 202 may be substantially free from structural defects such as threading dislocations and stacking faults. Consequently, the protrusion 202 may be used as a defect-free crystalline seed for subsequent lateral or radial growth of the second semiconductor material on the sidewalls 208 of the protrusion 202. An example of such a step is shown in FIGS. 5A to 5C.

Referring to FIGS. 5A to 5C, the protrusion 202 may be widened to fill the trench 110 by laterally or radially growing the second semiconductor material on sidewalls 208 of the protrusion 202. The result of this step of the process flow is the fin 106. Since the protrusion 202 may be substantially free from structural defects, the second semiconductor material laterally or radially grown on the sidewalls 208 of the protrusion 202 may also be substantially free from structural defects, thereby resulting in the fin 106 that is substantially free from structural defects.

The lateral or radial growth of the second semiconductor material on the sidewalls 208 of the protrusion 202 may be brought about by a second growth process (indicated as arrows 210). In some embodiments, as in the examples of FIGS. 5A to 5C, the lateral or radial growth of the second semiconductor material is performed on the protrusion 202 which has the surface 206 substantially coplanar with the major surface 104a of the isolation region 104. In such embodiments, the fin 106 may be disposed (e.g. fully disposed) within the trench 110 of the isolation region 104. In other embodiments, however, the lateral or radial growth of the second semiconductor material is performed on a protrusion 202 that extend out the trench 110 (e.g. the protrusion 202 shown in FIG. 7A). In such embodiments, a first region of the fin 106 may be disposed within the trench 110 and the isolation region 104 and a second region of the fin 106 may be disposed outside the trench 110 and over the major surface 104a of the isolation region 104. A cross-sectional view of an example of such an embodiment is shown in FIG. 7B.

The second growth process 210 may comprise a second epitaxial growth process, such as a second MOCVD process. The process parameters of the second growth process 210 may be chosen such that vertical growth of the second semiconductor material over the protrusion 202 is suppressed, prevented, or substantially eliminated, while lateral or radial growth of the second semiconductor material on the sidewalls 208 of the protrusion 202 is promoted (e.g. in a direction towards the sidewalls of the trench 110).

As an example, a temperature of the second growth process 210 may be in a range from about 300 degrees Celsius to about 500 degrees Celsius (e.g. in a range from about 350 degrees Celsius to about 450 degrees Celsius). As an example, the substrate 102 may be heated to and/or maintained at the above-mentioned range of temperatures. This range of temperatures may promote lateral or radial growth of the second semiconductor material, while suppressing, preventing, or otherwise eliminating vertical growth of the second semiconductor material. Illustratively, when the sidewalls 208 of the protrusion 202 have a <110> crystal orientation and the second semiconductor material comprises indium and arsenic (e.g. InAs or $In_xGa_{1-x}As$), the above-described temperature range suppresses, prevents, or otherwise substantially eliminates vertical growth of the second semiconductor material by decreasing the number of bonds available for indium atoms at surfaces of the second semiconductor material having a <111> crystal orientation. Surfaces of the semiconductor material having the <111> crystal orientation may include the surface 206 of the protrusion 202 facing away from the substrate 102. This decrease in the number of bonds available for indium atoms may be a result of arsenic desorption.

As another example, a molar ratio of precursors of the second growth process 210 may be greater than about 200 (e.g. in a range from about 400 to about 600) in order to promote lateral or radial growth of the second semiconductor material, while suppressing, preventing, or otherwise eliminating vertical growth of the second semiconductor material. Illustratively, when the second semiconductor material comprises a group III-V material, the molar ratio of the V/III precursors of the second growth process 210 may be in the above-described range in order to promote lateral or radial growth of the second semiconductor material, while suppressing, preventing, or otherwise eliminating vertical growth of the second semiconductor material.

The lateral or radial growth of the second semiconductor material proceeds until the trench 110 is filled, thereby forming the fin 106. In embodiments where a region of the fin 106 is disposed outside the trench 110 and over the major surface 104a of the isolation region 104 (e.g. as shown in FIG. 7B), a planarizing process (e.g. a chemical mechanical polishing (CMP) process) may be performed to remove the region of the fin 106 outside the trench 110 and over the major surface 104a of the isolation region 104, thereby resulting in the structure shown in FIGS. 5A to 5C. In some embodiments, the second semiconductor material grown using the first growth process 204 may be the same as the second semiconductor material grown using the second growth process 210. However, in other embodiments, the second semiconductor material grown using the first growth process 204 may be different from the second semiconductor material grown using the second growth process 210.

As described above, the fin 106 may be substantially free from structural defects such as threading dislocations and stacking faults. This may be a result of vertically growing (e.g. using the first growth process 204) the substantially defect-free protrusion 202 (e.g. nanowire) over the substrate 102, and by subsequently using the protrusion 202 as a defect-free crystalline seed to laterally or radially grow the second semiconductor material (e.g. using the second growth process 210) on sidewalls 208 of the protrusion 202 to fill the trench 110.

Figure 6B:
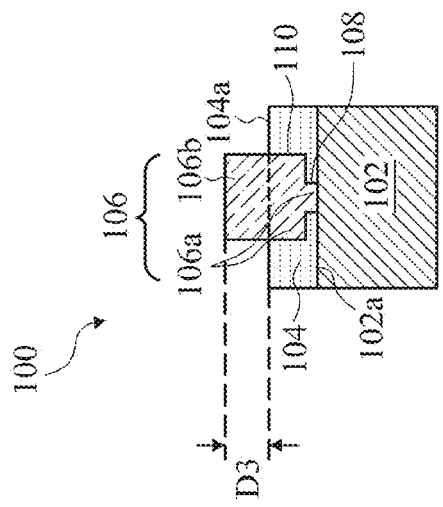
Figure 6C:
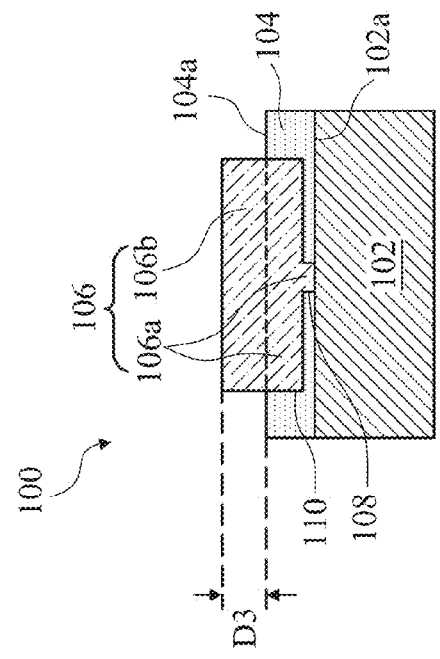
Figure 6A:
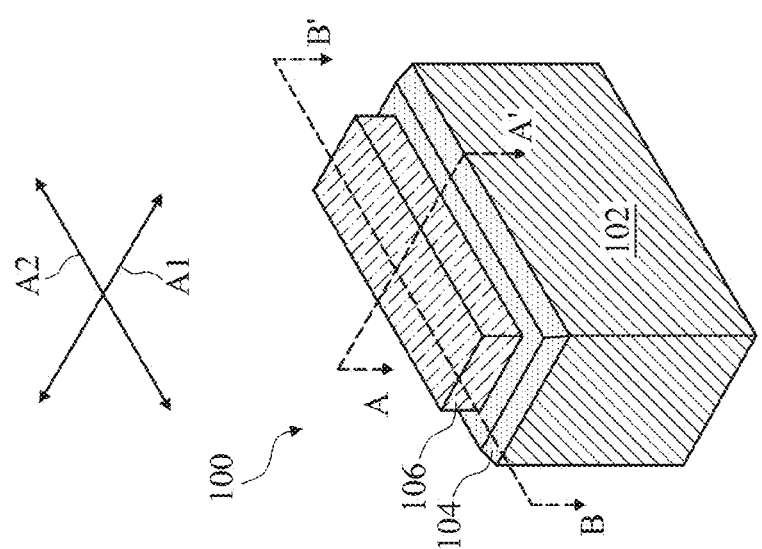

Referring to FIGS. 6A to 6C, in some embodiments, the major surface 104a of the isolation region 104 may be recessed to expose the portion 106b of the fin 106. In an example, this may be accomplished by the removal of the portion of the isolation region 104 surrounding the portion 106b of the fin 106 using an etching process, which may comprise use of a wet and/or a dry etchant. As an example, the etchant used may include hydrofluoric acid (HF) and/or SiCoNi. In some embodiments, the portion 106b of the fin 106 exposed by the recessing of the isolation region 104 may have a third dimension D3 (e.g. a height measured from the major surface 104a of the isolation region 104) that may be in a range from about 5 nanometers to about 50 nanometers. Following this, a gate structure (not shown) may be formed to wrap over a portion of the fin 106.

The method illustrated in FIGS. 2A to 2C, 3A to 3C, 4A to 4C, 5A to 5C, and 6A to 6C results in the FinFET device 100 being substantially free from structural defects such as stacking faults and threading dislocations, and thus can yield a FinFET device 100 that can deliver improved electrical performance.

Figure 8A:
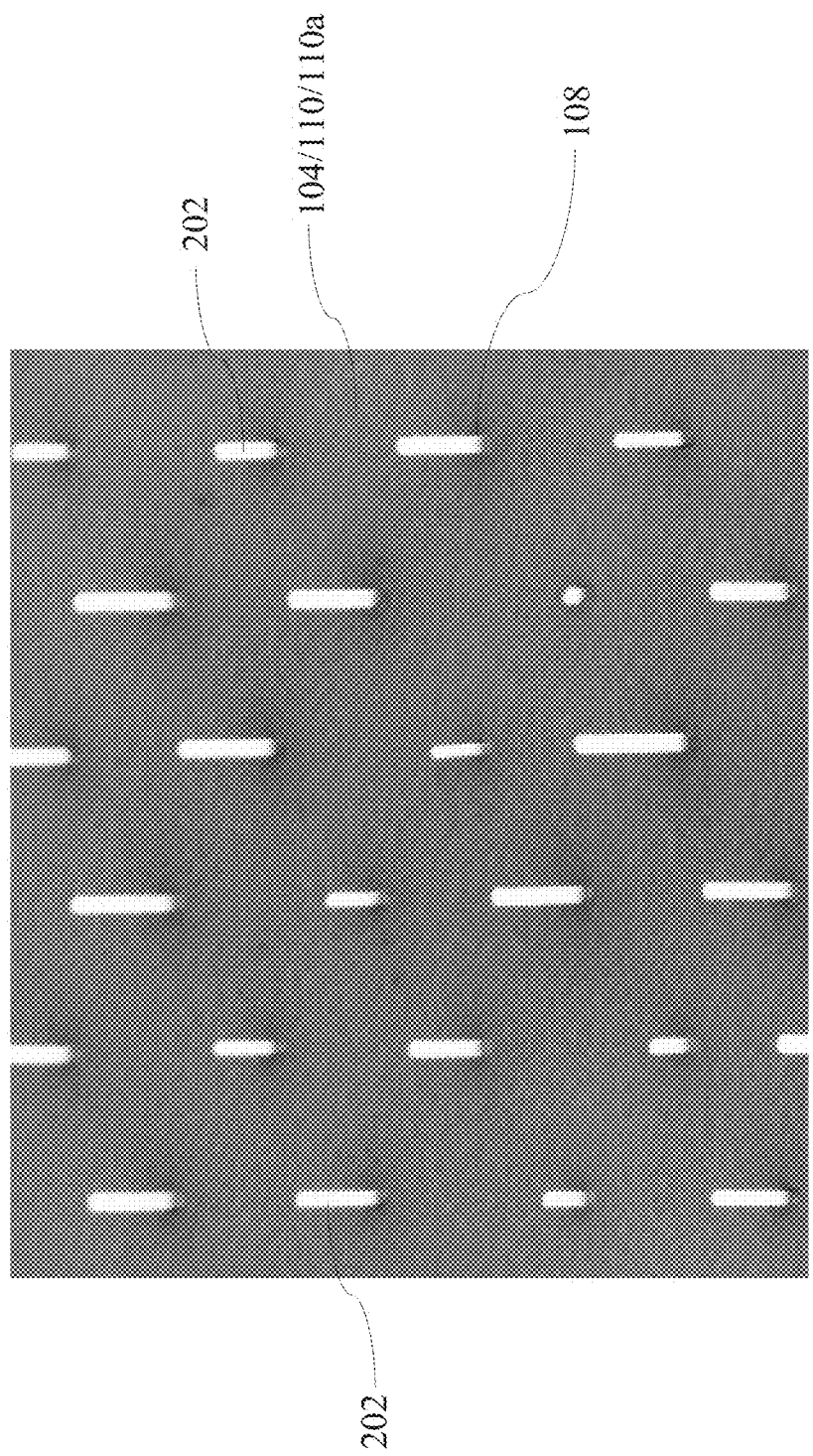
FIGS. 8A and 8B show magnified images of a FinFET device at intermediate stages of manufacture, in accordance with an embodiment.
Figure 8B:
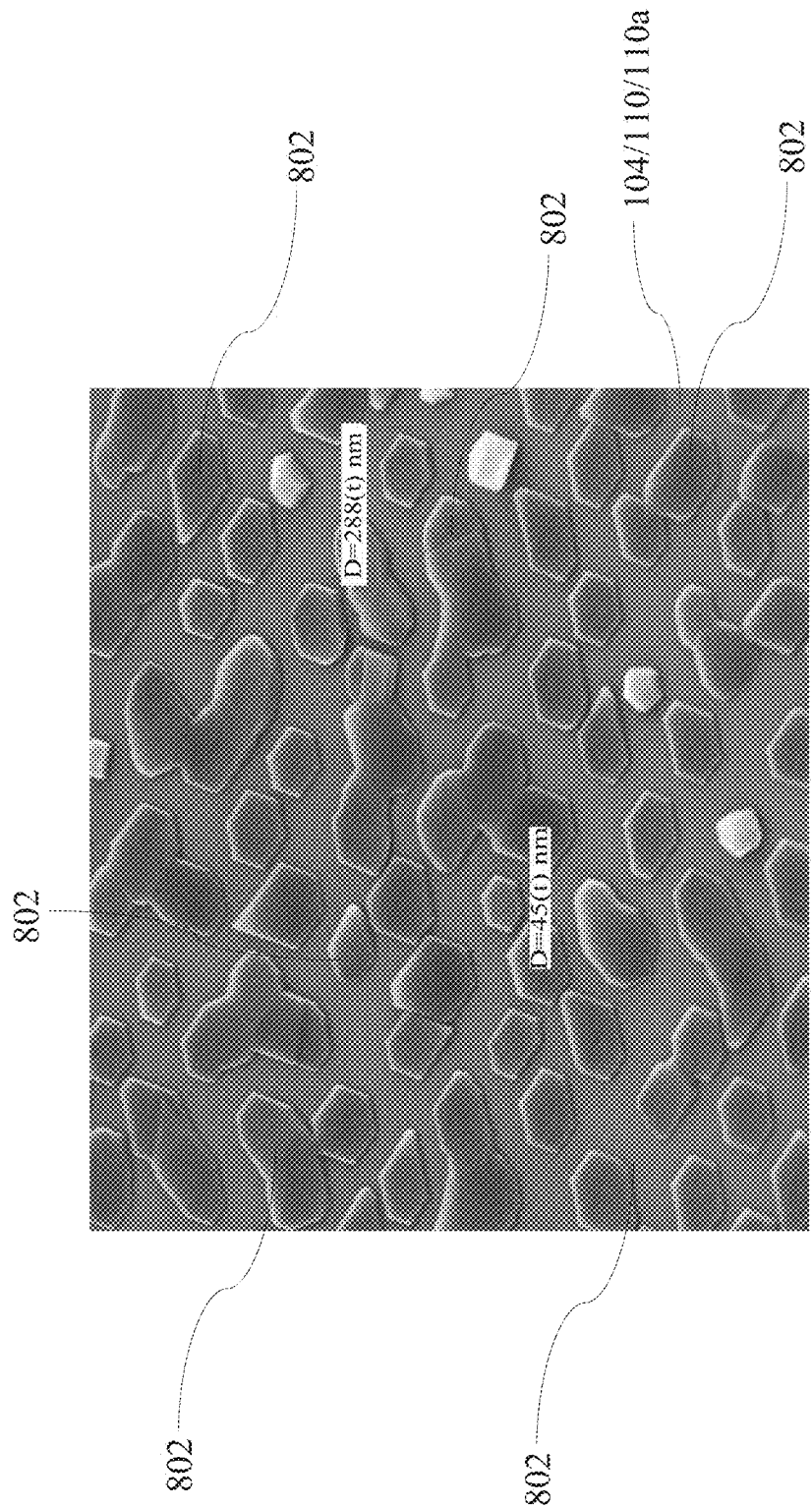

FIGS. 8A and 8B show magnified images (e.g. scanning electron microscope (SEM) images) of the FinFET device 100 at intermediate stages of manufacture, in accordance with one or more embodiments. FIG. 8A shows an example where a plurality of protrusions 202 are formed (e.g. by the first growth process 204). In the example of FIG. 8A, each of the plurality of protrusions 202 extends out of a respective opening 108 and in a direction substantially perpendicular to the floor 110a of the trench 110. In an embodiment, the protrusions 202 may be nanowires having a diameter in a range of about 40 nanometers to about 50 nanometers. As shown in FIG. 8A, vertical growth of the second semiconductor material is promoted, while lateral or radial growth of the second semiconductor material is suppressed (e.g. by choosing process parameters of the first growth process 204 as described above in relation to FIGS. 4A to 4C).

FIG. 8B shows an example where lateral or radial growth of the second semiconductor material from the sidewalls of the protrusions 202 is promoted (e.g. by the second growth process 210), while suppressing, preventing, or otherwise eliminating vertical growth of the second semiconductor material. This lateral or radial growth results in lateral semiconductor regions 802 disposed at the locations of the plurality of protrusions 202. It is noted that in this example, the second growth process 210 was performed for a predetermined period of time. It is also noted that the lateral or radial growth is crystalline, as evidenced by the hexagonal faceting of the lateral semiconductor regions 802.

FIGS. 9A to 9C, 10A to 10C, 11A to 11C, 12A to 12C, 13A to 13C, and 14A to 14C show a process flow illustrating a method of manufacturing a FinFET device, in accordance with one or more embodiments. Referring to FIGS. 9A to 9C, the isolation region 104 comprising the insulating material is formed over the major surface 102a of the substrate 102 (e.g. using similar processes described above in relation to FIGS. 2A to 2C). In this embodiment, the isolation region 104 may have a second thickness T2, which may be less than the first thickness T1. As an example, the second thickness T2 may be in a range from about 30 nanometers to about 50 nanometers, although other thickness may be possible as well.

Figure 10A:
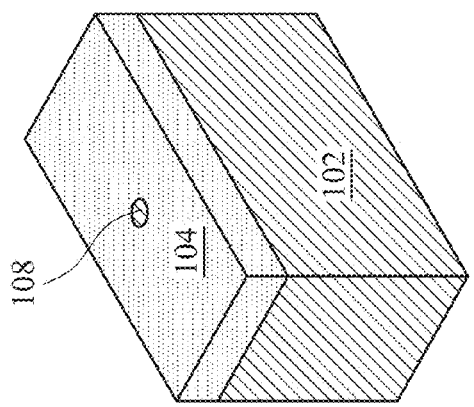
Figure 10C:
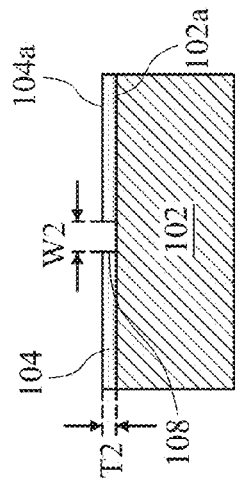
Figure 10B:
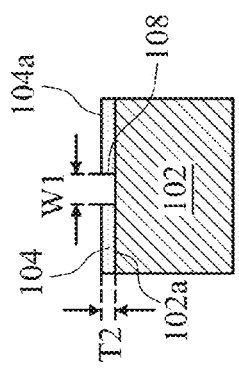

Referring to FIGS. 10A to 10C, the opening 108 may be formed in the isolation region 104 to expose a portion of the substrate 102. The opening 108 may be formed using similar processes described above in relation to FIGS. 3A to 3C). The opening 108 may have the first width W1 along the first axis A1, and the second width W2 along the second axis A2. As described above in relation to FIGS. 3A to 3C, the first width W1 and the second width W2 may be in a range from about 3 nanometers to about 50 nanometers, e.g. in a range from about 5 nanometers to about 40 nanometers, although other widths may be possible as well in accordance with other embodiments. In this embodiment, it is noted that the trench 110 is not formed; rather, only the opening 108 is formed in the isolation region 104.

Referring to FIGS. 11A to 11C, the protrusion 202 comprising the second semiconductor material may be formed in the opening 108 using the first growth process 204. In this embodiment, the protrusion 202 may also have the dimensions D1 and D2 described above in relation to FIGS. 4A to 4C. In particular, vertical growth of the second semiconductor material is promoted, while lateral or radial growth of the semiconductor material is suppressed by choosing process parameters of the first growth process 204 as described above in relation to FIGS. 4A to 4C.

Figure 12A:
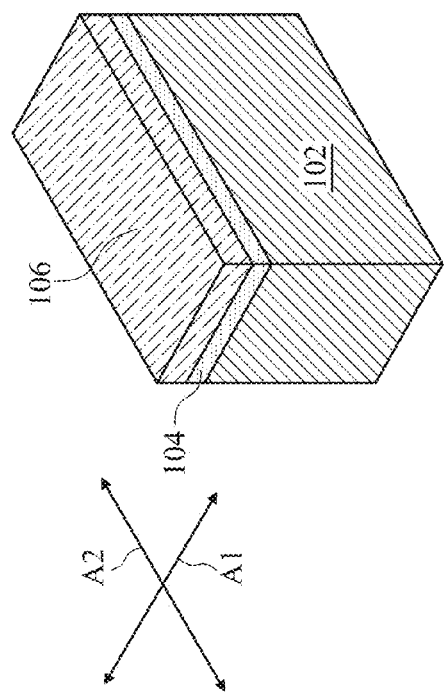
Figure 12B:
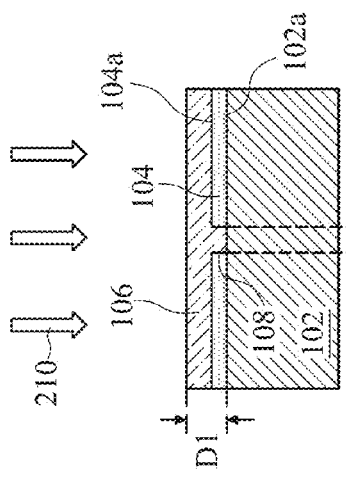
Figure 12C:
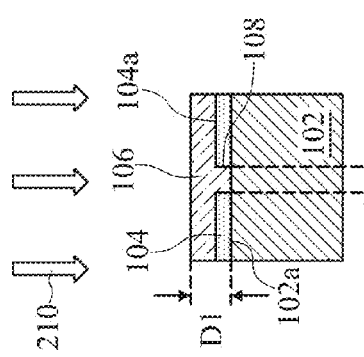

Referring to FIGS. 12A to 12C, the fin 106 may be formed by widening the protrusion 202 to cover the major surface 104a of the isolation region 104 using the second growth process 210 (e.g. having the process parameters described above in relation to FIGS. 5A to 5C). In the example of FIGS. 5A to 5C, the sidewalls of the trench 110 may act as a boundary to the lateral or radial growth of the second semiconductor material during the second growth process 210. However, in the example of FIGS. 12A to 12C, no such trench 110 exists. Consequently, the second growth process 210 may be performed for a predetermined period of time (e.g. a period of time sufficient to cover the major surface 104a of the isolation region 104).

Figure 13C:
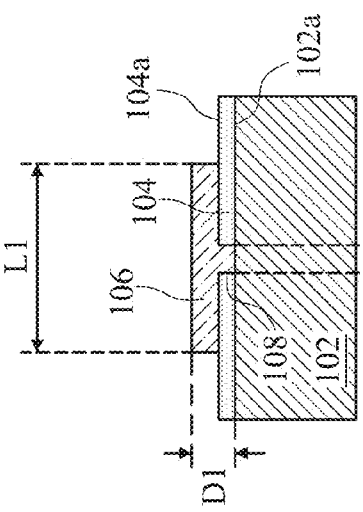
Figure 13A:
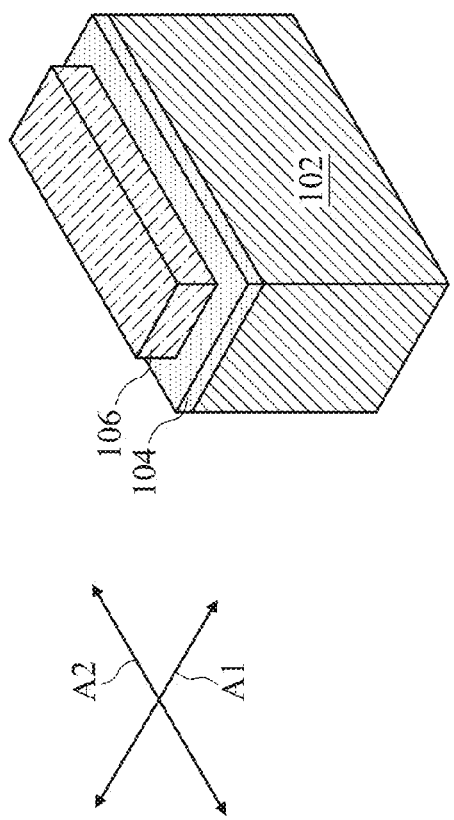
Figure 13B:
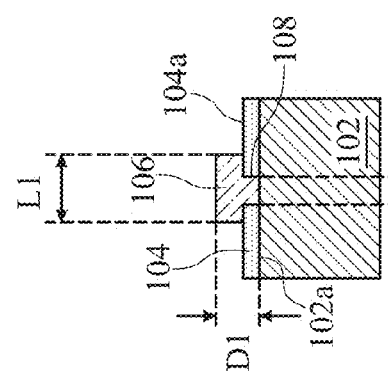

Referring to FIGS. 13A to 13C, the fin 106 may be patterned, e.g. using the photolithography and etching processes described above in relation to FIGS. 3A to 3C. The fin 106 may be patterned to have a first lateral extent L1 along the first axis A1, and a second lateral extent L2 along the second axis A2. In an embodiment, the first lateral extent L1 may be in a range from about 5 nanometers to about 50 nanometers, while the second lateral extent L2 may be in a range from about 20 nanometers to about 100 nanometers.

Figure 14B:
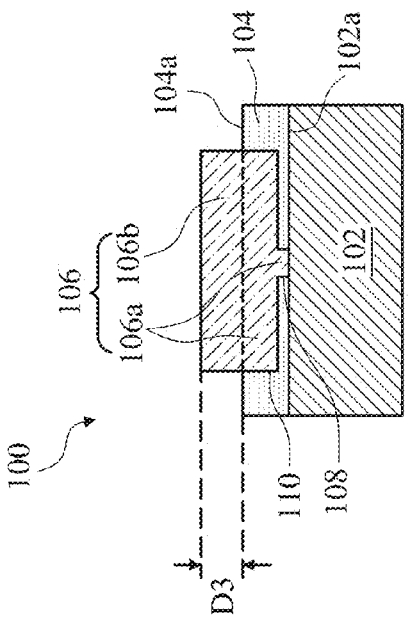
Figure 14C:
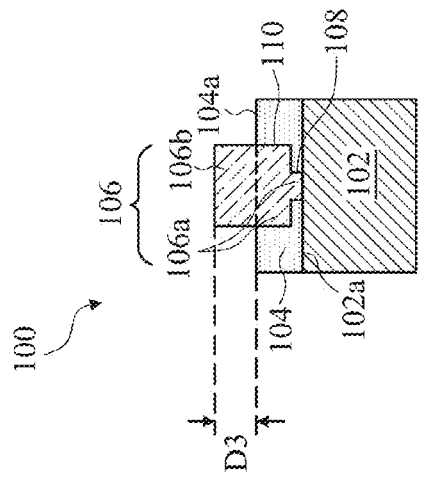
Figure 14A:
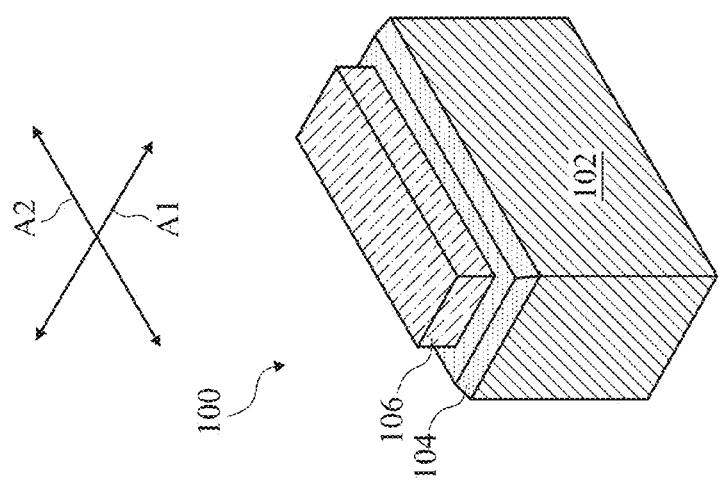

Referring to FIGS. 14A to 14C, portions of the isolation region 104 outside the first and second lateral extents L1 and L2 of the fin 106 may be increased in thickness to surround a portion (e.g. a lower portion) of the fin 106. As an example, the insulating material of the isolation region 104 may be deposited over the fin 106 to cover a major surface and sidewalls of the fin 106. The insulating material may be deposited using one or more of the processes described above in relation to FIGS. 2A to 2C. Subsequently, a planarizing process (e.g. a CMP process) may be performed to remove portions of the insulating material from the major surface of the fin 106. Following this, portions of the isolation region 104 surrounding an upper portion of the fin 106 may be removed using an etching process, which may be similar to the etching processes described above in relation to FIGS. 6A to 6C. In some embodiments, the portion 106b of the fin 106 exposed by the recessing of the isolation region 104 may have a third dimension D3 (e.g. a height measured from the major surface 104a of the isolation region 104) that may be in a range from about 5 nanometers to about 50 nanometers. Subsequent processing of the structure shown in FIGS. 14A to 14C may include forming a gate structure (not shown) to wrap over a portion of the fin 106.

The method illustrated in FIGS. 9A to 9C, 10A to 10C, 11A to 11C, 12A to 12C, 13A to 13C, and 14A to 14C results in the FinFET device 100 being substantially free from structural defects such as stacking faults and threading dislocations, and thus can yield a FinFET device 100 that can deliver improved electrical performance.

According to various embodiments presented herein, a method of manufacturing a semiconductor device is provided. The method may include: forming an opening in an insulating layer to expose a portion of a major surface of a substrate, the substrate comprising a first semiconductor material; forming a protrusion in the opening using a first epitaxial growth process, the protrusion comprising a first portion disposed in the opening and a second portion extending out of the opening, the protrusion comprising a second semiconductor material different from the first semiconductor material; and forming the second semiconductor material on sidewalls of the second portion of the protrusion using a second epitaxial growth process different from the first epitaxial growth process.

According to various embodiments presented herein, a method of manufacturing a semiconductor device is provided. The method may include: depositing an insulating layer over a substrate, the substrate comprising a first semiconductor material; forming a trench and an opening in the insulating layer, the opening disposed between the trench and the substrate, the opening exposing a portion of a major surface of the substrate and having smaller dimensions than the trench; growing a nanowire over the exposed portion of the major surface of the substrate, the nanowire filling the opening and further extending out of the opening away from the substrate, the nanowire comprising a second semiconductor material different from the first semiconductor material; and laterally growing the second semiconductor material on exposed sidewalls of the nanowire to fill the trench and form a fin structure.

According to various embodiments presented herein, a method of manufacturing a semiconductor device is provided. The method may include: forming a via in a dielectric layer disposed over a first semiconductor material, the via exposing a major surface of the first semiconductor material; forming, using a first growth process, a second semiconductor material having a higher carrier mobility than the first semiconductor material in the via, the second semiconductor material having a portion extending out of the via and having a dimension substantially equal to a dimension of the via; and increasing, using a second growth process, a lateral extent of the portion of the second semiconductor material extending out of the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an opening in an insulating layer to expose a portion of a major surface of a substrate, the substrate comprising a first semiconductor material;
    forming a protrusion in the opening using a first epitaxial growth process, the protrusion comprising a first portion disposed in the opening and a second portion extending out of the opening, the protrusion comprising a second semiconductor material different from the first semiconductor material; and
    forming a third portion on sidewalls of the second portion of the protrusion using a second epitaxial growth process different from the first epitaxial growth process, the third portion comprising the second semiconductor material,
    wherein the second epitaxial growth process suppresses growth of the second semiconductor material on surfaces of the protrusion other than the sidewalls of the protrusion.

2. The method of claim 1, wherein a temperature of the first epitaxial growth process is in a range from about 500 degrees Celsius to about 650 degrees Celsius, and wherein a temperature of the second growth process is in a range from about 300 degrees Celsius to about 500 degrees Celsius.

3. The method of claim 1, wherein a molar ratio of precursors of the first epitaxial growth process is in a range from about 300 to about 350, and wherein a molar ratio of precursors of the second epitaxial growth process is in a range from about 400 to about 600.

4. The method of claim 1, wherein the protrusion comprises a nanowire extending in a direction substantially perpendicular to the major surface of the substrate.

5. The method of claim 1, wherein the second semiconductor material has a higher carrier mobility compared to the first semiconductor material.

6. The method of claim 1, wherein the forming the opening in the insulating layer comprises a photolithography and etching process.

7. The method of claim 1, wherein the first semiconductor material comprises at least one of silicon, germanium, gallium, or arsenic.

8. The method of claim 1, wherein the second semiconductor material comprises at least one of germanium, silicon-germanium, indium arsenide, indium gallium arsenide, indium antimonide, gallium arsenide, or gallium antimonide.

9. A method, comprising:
    depositing an insulating layer over a substrate, the substrate comprising a first semiconductor material;
    forming a trench and an opening in the insulating layer, the opening disposed between the trench and the substrate, the opening exposing a portion of a major surface of the substrate and having smaller dimensions than the trench;
    growing a nanowire over the exposed portion of the major surface of the substrate, the nanowire filling the opening and further extending out of the opening away from the substrate, the nanowire comprising a second semiconductor material different from the first semiconductor material; and
    laterally growing the second semiconductor material on exposed sidewalls of the nanowire to fill the trench and form a fin structure.

10. The method of claim 9, further comprising recessing a portion of the trench to expose a portion of the fin structure.

11. The method of claim 10, wherein the recessing comprises an etching process.

12. The method of claim 9, further comprising planarizing the fin structure, wherein a major surface of the fin structure is substantially coplanar with a major surface of the trench.

13. The method of claim 9, wherein the growing a nanowire and the laterally growing the second semiconductor material comprise metal organic chemical vapor deposition processes.

14. The method of claim 9, wherein the nanowire and the fin structure are substantially free from threading dislocations.

15. A method, comprising:
    forming a via in a dielectric layer disposed over a first semiconductor material, the via exposing a major surface of the first semiconductor material;
    forming, using a first growth process, a second semiconductor material having a higher carrier mobility than the first semiconductor material in the via, the second semiconductor material having a portion extending out of the via and having a dimension substantially equal to a dimension of the via, wherein the first growth process promotes vertical growth of the second semiconductor material and suppresses lateral growth of the second semiconductor material; and
    increasing, using a second growth process, a lateral extent of the portion of the second semiconductor material extending out of the via, wherein the second growth process suppresses vertical growth of the second semiconductor material and promotes lateral growth of the second semiconductor material.

16. The method of claim 15, wherein a temperature of the first semiconductor material during the first growth process is in a range from about 500 degrees Celsius to about 650 degrees Celsius, and wherein a temperature of the first semiconductor material during the second growth process is in a range from about 300 degrees Celsius to about 500 degrees Celsius.

17. The method of claim 15, wherein a molar ratio of precursors of the first growth process is in a range from about 300 to about 350, and wherein a molar ratio of precursors of the second growth process is in a range from about 400 to about 600.

18. The method of claim 15, wherein the dimension of the via comprises a width of the via, and wherein the width of the via is in a range from about 3 nanometers to about 50 nanometers.

19. The method of claim 15, further comprising forming a trench in the dielectric layer.

* * * * *